(12) United States Patent
Gao (10) Patent No.: US 11,785,746 B2
(45) Date of Patent: Oct. 10, 2023

(54) SERVER DESIGN WITH HIGH RELIABILITY COOLING HARDWARE

(71) Applicant: BAIDU USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 127 days.

(21) Appl. No.: 17/484,079

(22) Filed: Sep. 24, 2021

(65) Prior Publication Data

US 2023/0096919 A1    Mar. 30, 2023

(51) Int. Cl.
*H05K 7/20* (2006.01)

(52) U.S. Cl.
CPC ..... *H05K 7/20763* (2013.01); *H05K 7/20254* (2013.01); *H05K 7/20272* (2013.01)

(58) Field of Classification Search
CPC .......... H05K 7/20763; H05K 7/20254; H05K 7/20272
USPC ..................................... 361/679.46
See application file for complete search history.

(56) References Cited

U.S. PATENT DOCUMENTS

| | | | |
|---|---|---|---|
| 5,731,954 A * | 3/1998 | Cheon ................ | G06F 1/20 174/15.1 |
| 6,836,407 B2 * | 12/2004 | Faneuf ............... | H05K 7/20809 361/695 |
| 7,012,807 B2 * | 3/2006 | Chu ..................... | G06F 1/20 165/80.4 |
| 7,336,487 B1 * | 2/2008 | Chrysler ............. | H01L 23/473 361/679.48 |
| 7,408,776 B1 * | 8/2008 | Campbell ........... | H05K 7/20509 257/E23.098 |
| 7,420,804 B2 * | 9/2008 | Leija .................. | H05K 7/20772 361/679.48 |
| 7,428,151 B2 * | 9/2008 | Sonnabend .......... | G06F 1/20 361/698 |
| 7,593,227 B2 * | 9/2009 | Campbell ........... | H05K 7/20772 361/699 |
| 7,639,499 B1 * | 12/2009 | Campbell ........... | H05K 7/20772 165/104.19 |
| 7,944,694 B2 * | 5/2011 | Campbell ........... | H05K 7/20809 174/15.1 |
| 7,957,132 B2 * | 6/2011 | Fried ................. | F28D 15/0266 361/694 |

(Continued)

*Primary Examiner* — Anatoly Vortman
(74) *Attorney, Agent, or Firm* — WOMBLE BOND DICKINSON (US) LLP (57) ABSTRACT

In one embodiment, a liquid cooling system includes a coolant distribution device including a first set of fluid connectors to receive a cooling liquid and a second set of fluid connectors to distribute coolant to a cooling device and a cooling device coupled to the coolant distribution device. The cooling device includes an elongated chassis, a cooling plate integrated, contained, and/or prefabricated within the elongated chassis of the cooling device, and a fluid distribution channel integrated within the elongated chassis to provide cooling liquid to the cooling plate. The cooling device further includes fluid connectors to receive the cooling liquid from a coolant distribution device and a blocking channel disposed between the cooling plate and the fluid connectors, the blocking channel to mate with a blocking plate of the coolant distribution device.

20 Claims, 7 Drawing Sheets

(56) References Cited

U.S. PATENT DOCUMENTS

| | | | |
|---|---|---|---|
| 8,240,165 B2* | 8/2012 | Novotny | H05K 7/20354 |
| | | | 165/104.31 |
| 9,363,886 B2* | 6/2016 | Sakamoto | F28D 15/0266 |
| 9,483,091 B2* | 11/2016 | Watanabe | G06F 1/20 |
| 9,693,483 B2* | 6/2017 | Iwasaki | H05K 7/20781 |
| 11,596,086 B2* | 2/2023 | Artman | H05K 7/20318 |
| 2004/0008483 A1* | 1/2004 | Cheon | G06F 1/20 |
| | | | 361/699 |
| 2004/0057211 A1* | 3/2004 | Kondo | G06F 1/20 |
| | | | 361/696 |
| 2006/0002080 A1* | 1/2006 | Leija | H05K 7/20772 |
| | | | 361/679.52 |
| 2006/0187638 A1* | 8/2006 | Vinson | H05K 7/20009 |
| | | | 361/698 |
| 2008/0259566 A1* | 10/2008 | Fried | H05K 7/20809 |
| | | | 165/80.4 |
| 2009/0084522 A1* | 4/2009 | Foglieni | F24D 19/0209 |
| | | | 165/67 |
| 2021/0084793 A1* | 3/2021 | Gao | H05K 7/20781 |
| 2023/0061298 A1* | 3/2023 | Gao | H05K 7/20509 |

* cited by examiner

SERVER DESIGN WITH HIGH RELIABILITY COOLING HARDWARE

FIELD OF THE DISCLOSURE

Embodiments of the present invention relate generally to data centers. More particularly, embodiments of the invention relate to cooling hardware of a server design with high reliability.

BACKGROUND

Thermal management of a data center that includes several active electronic racks is critical to ensure proper performance of servers and other IT equipment operating in the racks. Without proper thermal management the thermal environment within the racks may exceed operational thresholds, resulting in operational consequences (e.g., servers failing, etc.). One way to manage the thermal environment is the use of cooling air to cool the IT equipment. A majority of existing data centers are air cooled. Recently, data centers have been deploying more high-power density electronic racks, where more high density chips are packaged closer together to provide more processing power. Cooling these high-density racks by maintaining a proper thermal environment may be a challenge with existing cooling systems, especially within the constant increasing power density of the racks.

Liquid cooling systems may be used to cool high-density racks due to the increased cooling capacity of liquid cooling. Existing solutions for liquid cooling systems may require fluid connections and hoses to distribute cooling liquid to cooling devices of the electronic rack. Such fluid connections and hoses therefore coexist with electronics on the electronic rack. The connections and hoses of the liquid cooling system may be prone to leaks which may cause damage to the electronics of the rack.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Embodiments of the present disclosure provide a high reliability liquid cooling hardware for a server. The disclosure includes a cooling device and a cooling distribution device assembled together for cooling servers with multiple PCIE based accelerator devices. The cooling device may be coupled with the cooling distribution device via fluid connections. The cooling device can include a blocking channel between the fluid connections and the electronics of the server, the blocking channel to be mated with a blocking plate of the cooling distribution device. The blocking plate of the distribution device may be inserted into the blocking channel of the cooling device when the two devices are integrated together to provide segregation of fluid connections from electronics of the server. Additionally, the cooling distribution device can include leak detection channels on either side of the fluid connections. Leak detection cables may be included in the leak detection channels to detection any fluid that enters the leak detection channels. Therefore, a leak can be detected immediately upon the leak occurring.

Embodiments of the present disclosure provide for a highly reliable liquid cooling design which mitigates potential damage to server electronics due to fluid leakage. In particular, embodiments of the present disclosure enable a full segregation of any potential failed fluid ports and the electronics. The cooling hardware may be scalable to a large number of PCIE accelerators. The design in the present disclosure may accommodate different server architectures, rack configurations, and different PCIE devices. The present disclosure may further be expandable for increasing power densities.

According to one embodiment, a liquid cooling system includes a coolant distribution device including a first set of fluid connectors to receive a cooling liquid and a second set of fluid connectors to distribute coolant to a cooling device and a cooling device coupled to the coolant distribution device. The cooling device includes an elongated chassis, a cooling plate integrated within the elongated chassis of the cooling device, and a fluid distribution channel integrated within the elongated chassis to provide cooling liquid to the cooling plate. The cooling device further includes fluid connectors to receive the cooling liquid from a coolant distribution device and a blocking channel disposed between the cooling plate and the fluid connectors, the blocking channel to mate with a blocking plate of the coolant distribution device.

In some embodiments, the blocking channel includes a hollow channel across a bottom of the elongated chassis to receive the blocking plate upon connection of the cooling device to the coolant distribution device. In some embodiments, the cooling plate is disposed on a surface of the elongated chassis to extract heat from one or more electronic devices. In some embodiments, the fluid connectors are disposed on a bottom surface of the elongated chassis. In some embodiments, the blocking plate of the coolant distribution device mated with the blocking channel of the cooling device fully segregates electronics of a server from the fluid connectors.

In some embodiments, the coolant distribution device includes at least one leak detection channel to detect cooling liquid leaks at a coupling of the fluid connectors of the cooling device to the coolant distribution device. In some embodiments, the at least one leak detection channel includes a leak detection channel on each side of the coupling of the fluid connectors of the cooling device to the coolant distribution device.

Figure 1:
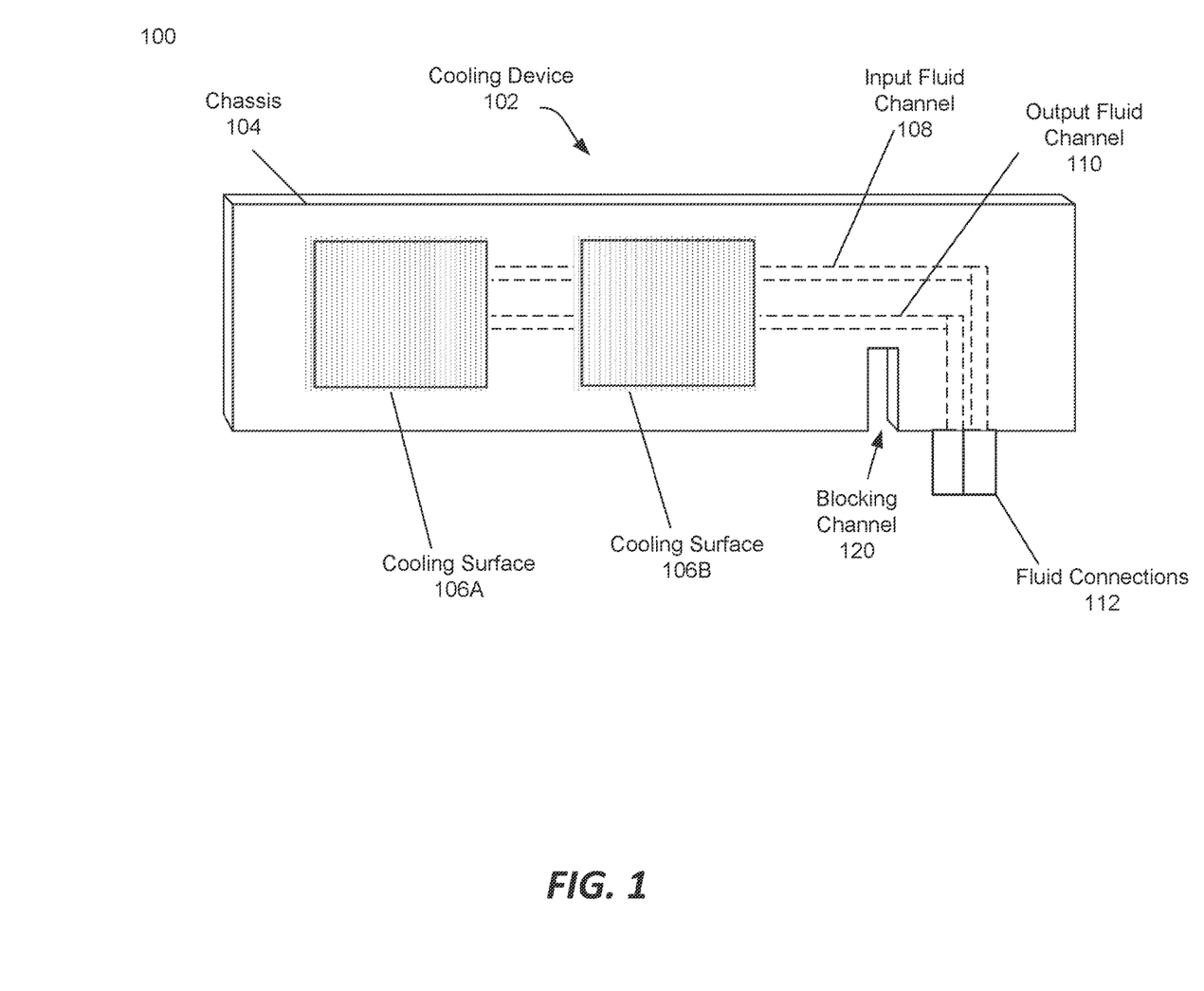
FIG. 1 is a side view of a cooling device for a high reliability liquid cooling system, according to one embodiment.

FIG. 1 shows a side view 100 of a cooling device for a high reliability liquid cooling system, according to one embodiment. The device includes integrated cooling channels to circulate a cooling liquid from external fluid connectors to cooling areas exposed on a surface of the cooling device. The cooling device further include a blocking channel or slot on a bottom surface of the device between the fluid connectors and the cooling areas. As described in more detail with respect to FIG. 5, the blocking channel may receive a blocking plate of a distribution device when integrated with the cooling device.

In one embodiment, referring to FIG. 1, the cooling device 102 includes an elongated chassis 104. One or more cooling surfaces 106A-B may be disposed on a surface of the chassis 104 such that the cooling surfaces 106A-B may be placed in contact with an electronics chip of a PCIE package. The chassis 104 may include fluid connections 112 and an input fluid channel 108 and an output fluid channel 110. Input fluid channel 108 may receive a cooling liquid from fluid connections 112 and provide the cooling liquid to the cooling surfaces 106A-B while output fluid channel 110 may return the cooling liquid from the cooling surfaces 106A-B to the fluid connections 112 along with heat extracted from one or more electronics via cooling surfaces 106A-B. Input fluid channel 108 and output fluid channel 110 may be fully integrated within the chassis 104 of the cooling device 102 such that fluid connections 112 are the only external fluid connections of the cooling device 102. Although only two fluid channels are depicted, the chassis 104 may include any number of fluid channels providing liquid coolant to any number of cooling surfaces of the chassis 104. In an embodiment, the fluid connections 112 are designed with dripless blind mating connectors.

In one embodiment, the chassis 104 further includes a blocking channel 120. The blocking channel 120 may be a slot, groove, or indentation in the chassis 104 to provide a receiving point for a blocking plate, as described in further detail below with respect to FIG. 5. For example, the cooling device 102 may be coupled with a cooling distribution device by connecting the fluid connections 112 of the cooling device with fluid connections of the cooling distribution device and inserting a blocking plate of the cooling distribution device into the blocking channel 120.

Figure 2:
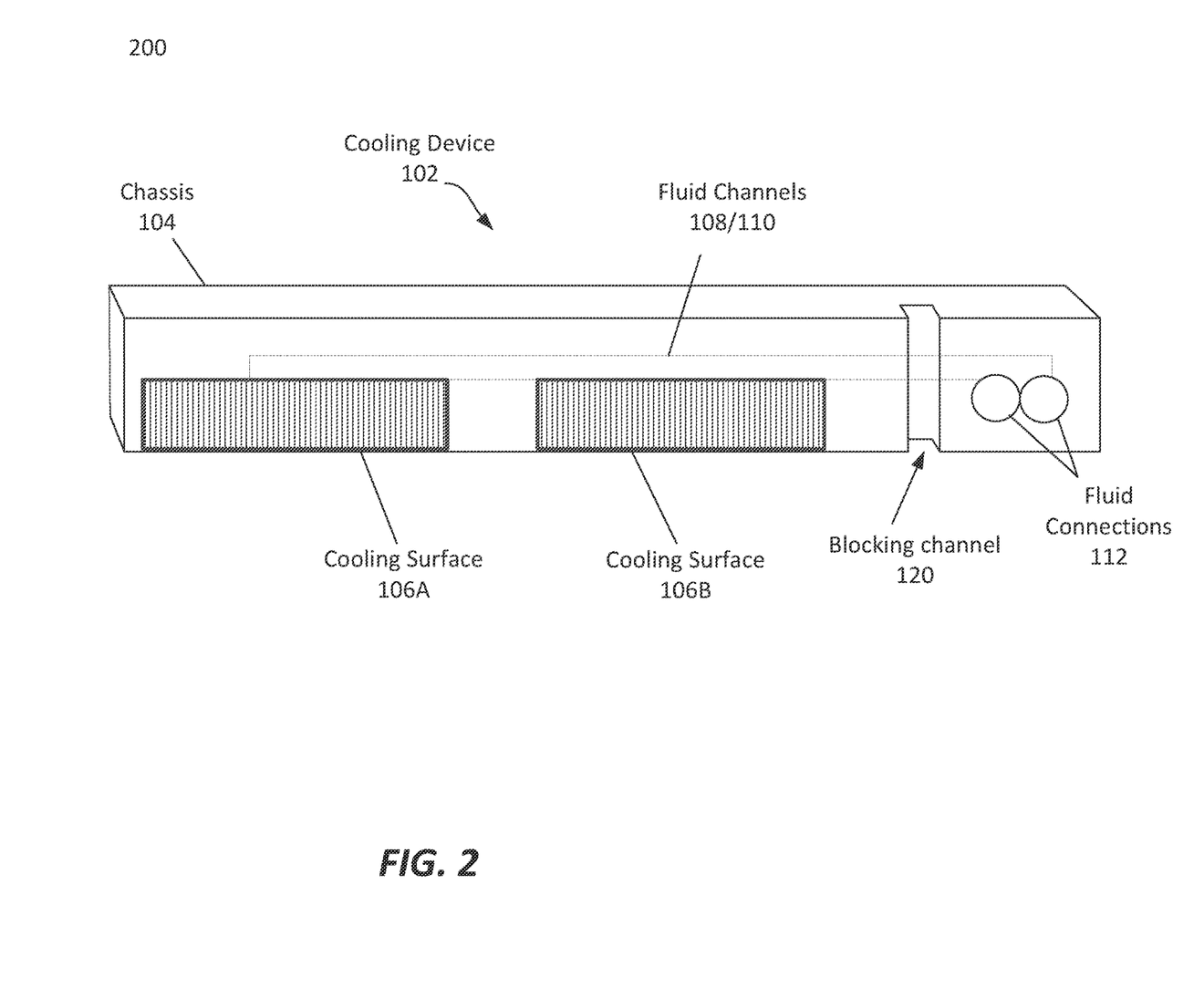
FIG. 2 is a bottom view of a cooling device for a high reliability liquid cooling system, according to one embodiment.

FIG. 2 shows a bottom view 200 of a cooling device for a high reliability liquid cooling system, according to one embodiment. The device includes integrated cooling channels to circulate a cooling liquid from external fluid connectors to cooling areas exposed on a surface of the cooling device. The cooling device further include a blocking channel or slot on a bottom surface of the device between the fluid connectors and the cooling areas. As described in more detail with respect to FIG. 5, the blocking channel may receive a blocking plate of a distribution device when integrated with the cooling device.

In one embodiment, as depicted in FIG. 2, the cooling surfaces 106A-B may be exposed on a surface of one side of the chassis 104 and the fluid channels 108 and 110 may provide cooling liquid to and from both of the cooling surfaces 106A-B. The blocking channel 120 may cut across the entire width of the chassis 104. In some embodiments, the cooling surfaces 106A-B may be cooling plates including a thermally conductive material to extract heat from electronics in contact with the surface, as described in further detail with respect to FIG. 3 below.

Figure 3:
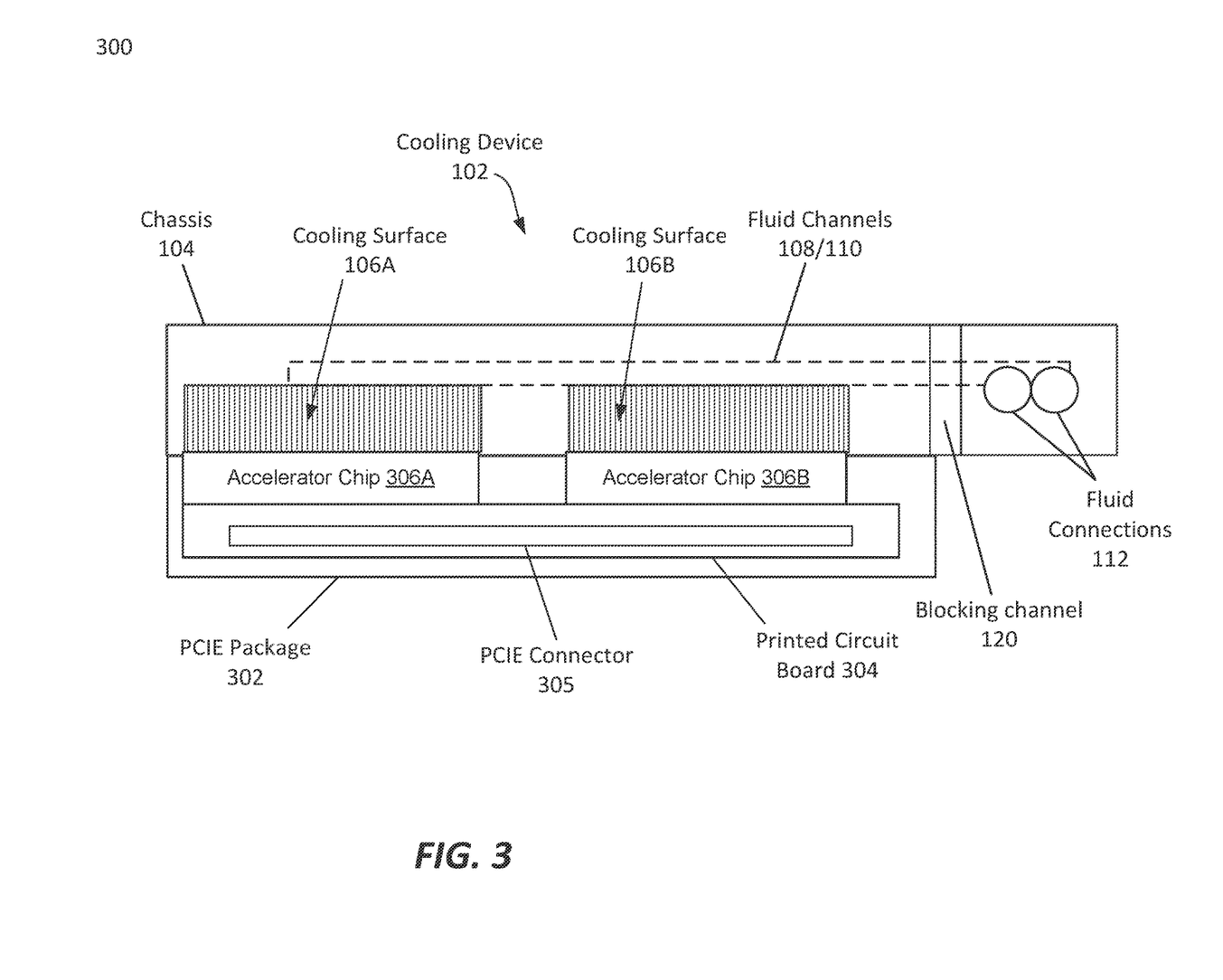
FIG. 3 is a bottom view of a cooling device coupled with a PCIE package for a high reliability liquid cooling system, according to one embodiment.

FIG. 3 shows a bottom view 300 of a cooling device coupled with a PCIE package for a high reliability liquid cooling system, according to one embodiment. A PCIE package may include a printed circuit board (PCB) and one or more accelerator chips. The PCB may also include any other type of electronic chips. The cooling device may be attached to the PCIE package with cooling areas aligned with the acceleration chips. The cooling device may include cooling areas that are dedicated to match each of the acceleration chips on the PCB of the PCIE package.

In one embodiment, as depicted in FIG. 3, the cooling device 102 may be coupled with a PCIE package 302. For example, the PCIE package 302 may be a PCIE device attached to a PCIE bus of a server motherboard (e.g., via PCIE connector 305). The PCIE package may include a printed circuit board (PCB) 304 with one or more electronic chips (e.g., accelerator chips 306A-B) attached to the PCB 304. The accelerator chips 306A-B may be high power density processors (e.g., graphics processing units) that generate a large amount of heat. Thus, the cooling surfaces 106A-B may be aligned with the accelerator chips 306A-B to extract heat generated by the accelerator chips 306A-B. The PCB 304 may include a PCIE connector 305, or other form of electronic connections, to couple the PCB 304 to a server motherboard.

Particularly, the chassis 104 of the cooling device 102 may be attached to the PCIE package 302 with the cooling surfaces 106A-B in contact with the accelerator chips 306A-B. The fluid channels 108 and 110 may provide cooling liquid to and from the cooling surfaces 106A-B to extract heat from the accelerator chips 306A-B. Additionally, the chassis 104 of the cooling device may have a minimum length such that the PCIE package 302 does not extend past the blocking channel 120 when the cooling device 102 is attached to the PCIE package 302.

Figure 4:
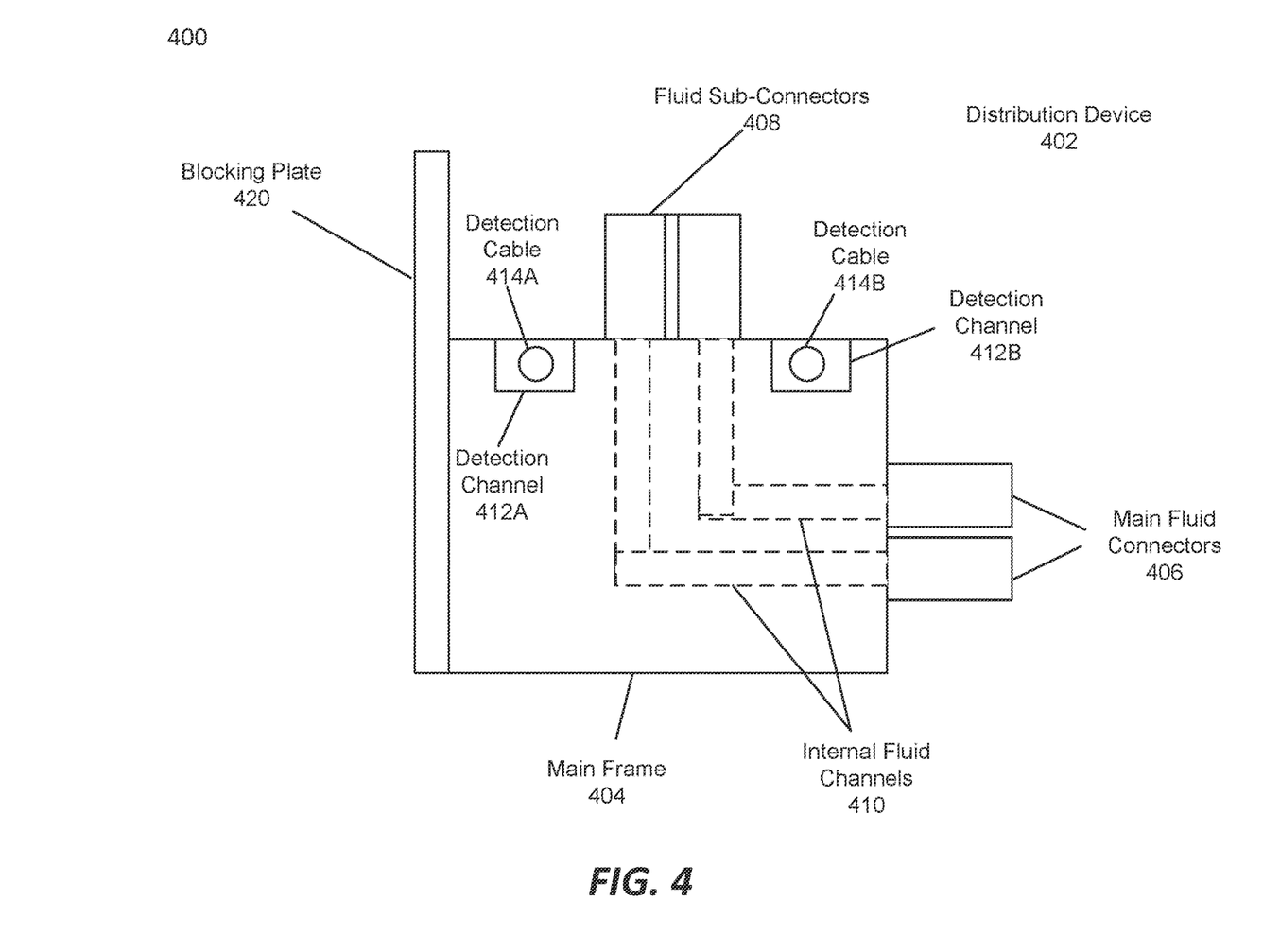
FIG. 4 shows a side view of a cooling distribution device for a high reliability liquid cooling system, according to one embodiment.

FIG. 4 shows a side view 400 of a cooling distribution device for a high reliability liquid cooling system, according to one embodiment. The cooling distribution device may include a main frame with fluid sub-connectors on top to distribute cooling liquid received from main fluid connectors on a side of the distribution device to one or more cooling devices. The main frame may include internal fluid channels connecting the main fluid connectors to the fluid sub-connectors along the top of the main frame. The main frame of the cooling distribution device may further include one or more leak detection channels with a detection cable running each of the leak detection channels. For example, one leak detection channel may be included on each side of the fluid sub-connectors on the top of the main frame. The cooling distribution device further includes a blocking plate on a side of the main frame that extends above a top surface of the main frame. The blocking plate may act as a barrier to prevent leaked fluid from traveling from the fluid connections to the electronics of the server.

In some embodiments, as depicted in FIG. 4, a cooling distribution device 402 may include a main frame 404 and a blocking plate 420 coupled to the main frame 404. The main frame 404 may include main fluid connectors 406 to receive cooling liquid from an external source and to return the cooling liquid to the external source. The main frame 404 may further include internal fluid channels 410 to provide the cooling liquid from the main fluid connectors 406 to one or more fluid sub-connectors 408. The fluid sub-connectors 408 may be distributed along a top surface of the main frame. In some embodiments, cooling device (e.g., cooling device 102 described above with respect to FIGS. 1-3) may be coupled with the distribution device 402 via fluid sub-connectors. The fluid sub-connectors 408 may provide the cooling liquid to each corresponding cooling device, as further described with respect to FIG. 6 below. The internal fluid channels 410 may run along a length of the main frame 404 and provide the cooling liquid to several fluid sub-connectors and the cooling devices. In some embodiments, the fluid sub-connectors 408 are dripless connectors.

In some embodiments, the main frame 404 further includes one or more detection channels 412A-B and one each of which may include a detection cable 414A-B. The detection cable 414A-B may detect a fluid in contact with the detection cable 414A-B (e.g., the fluid may bridge wires of the cable to generate a current). The detection channel 412A in combination with the detection cables 414A-B may detect a fluid leak from the fluid sub-connectors. The detection channel 412A-B may run along the length of the main frame 404 on each side of the fluid sub-connectors to quickly detect any fluid leaks upon the leaked fluid contacting the fluid detection cables 414A-B in the detection channels 412A-B. The blocking plate 420 of the distribution device 402 may extend the entire width of a server chassis. Thus, the blocking plate 420 may segregate the fluid sub-connectors 408 of the main frame 404 from the electronics of the server (e.g., located on the left side of the blocking plate 420 depicted in FIG. 4. The locations of the detection channels 412A-B on the main frame 404 can be optimized based on possible fluid leakage scenarios and leak fluid flowing pattern, to faster detect any leaked fluid.

Figure 5:
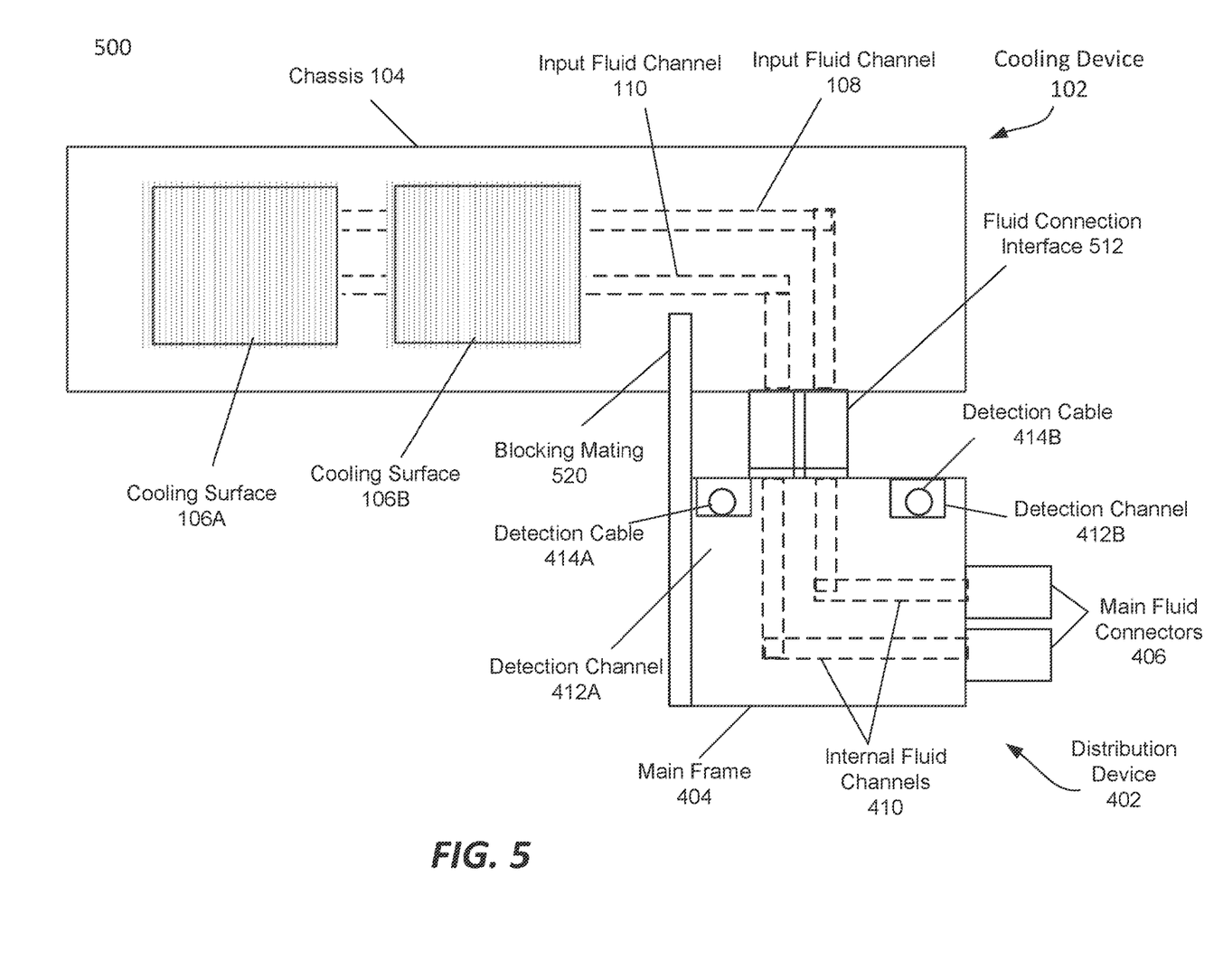
FIG. 5 shows a side view of a cooling device integrated with a cooling distribution device for high reliability liquid cooling system, according to one embodiment.

FIG. 5 shows a side view 500 of a cooling device integrated with a cooling distribution device for high reliability liquid cooling system, according to one embodiment. The cooling device may be connected to the distribution device through connectors, such as blind mating connectors. Additionally, the blocking plate may of the cooling distribution device may be inserted into the blocking channel of the cooling device. The fluid connections enable cooling liquid to be distributed to the cooling device from the cooling distribution device and the mating of the blocking channel and the blocking plate provides for a fluid segregation and blocking of fluid should any leak occur on the connectors or the connection interfaces.

In some embodiments, as depicted in FIG. 5, a cooling device 102 may be coupled with a cooling distribution device 402. As coupled, fluid connections of the cooling device 102 and fluid sub-connectors or the distribution device 402 may be coupled at the fluid connection interface 512. Additionally, the blocking plate of the distribution device may be inserted into the blocking channel of the cooling device 102 at the blocking mating 520. Therefore, the distribution device 402 can provide cooling liquid to the cooling device 102 via the fluid connection interface 512 while separating the fluid connection interface 512 from any electronics of a server located on the other side of the blocking plate and blocking mating 520. Furthermore, the detection channels 412A-B and detection cables 414A-B may detect any leaks at the fluid connection interface 512.

Figure 6:
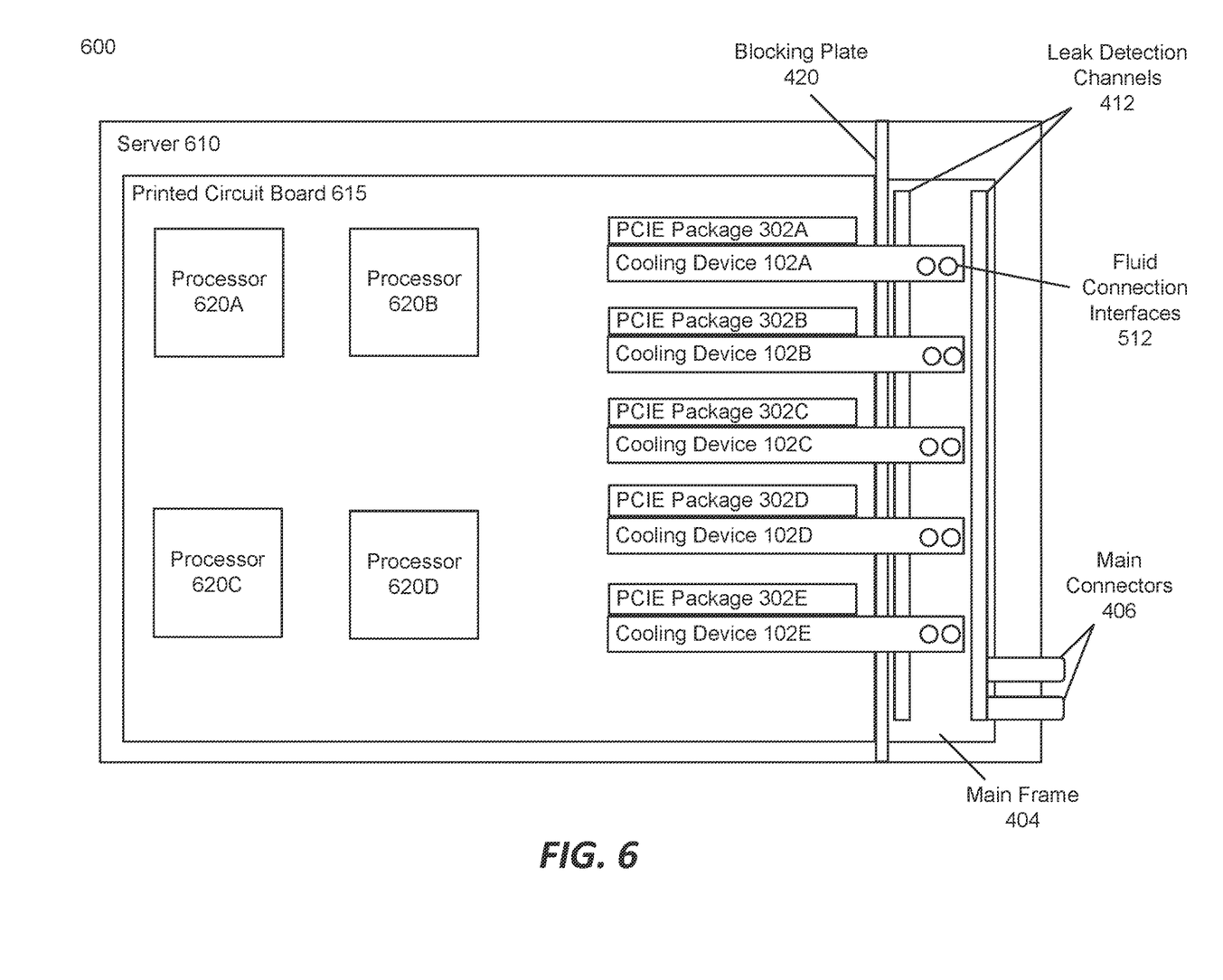
FIG. 6 shows a top view of a server with multiple cooling devices coupled with PCIE packages of the server, according to one embodiment.

FIG. 6 shows a top view 600 of a server with multiple cooling devices coupled with PCIE packages of the server, according to some embodiments. Any number of PCIE devices may be included on a PCB (e.g., a motherboard) and a liquid cooling device may be attached to each of the PCIE devices. The liquid distribution device may be attached to, or integrated in, a chassis of the server. The internal fluid channels of the cooling distribution device may distribute cooling liquid to each of the cooling devices. The leak detection channels may run along the length of the fluid distribution device on each side of the fluid connections and may each include a leak detection cable to quickly detection any fluid leaks before the fluid is exposed to electronics of the server. Additionally, the blocking plate of the fluid distribution device may run the entire width of the server chassis to provide full segregation of the fluid from electronics of the server. Thus, the design provides both segregation of fluid from electronics as well as fast leak detection.

In some embodiments, as depicted in FIG. 6, a server 610 may include a printed circuit board 615. One or more electronic devices may be electronically coupled to the PCB 615. For example, one or more processors 620A-D (e.g., central processing units) may be included on the PCB 615. Additionally, one or more PCIE packages 302A-E may be electronically coupled to the PCB 615 (e.g., via PCIE interconnects). In some embodiments, the PCIE packages 302A-E may be vertically attached to the PCB 615 and may include one or more accelerator device, such as graphics processing devices. The PCB 615 as depicted in FIG. 6, including the board layout and numbers of the processors, is representative rather than limiting. The PCB 615 may include any board layout, any number of processors, and any number of cooling devices and PCIE packages.

In some embodiments, the server 610 may further include a distribution device with a main frame 404 for distributing a cooling liquid to the cooling devices 102A-E. The main frame 404 may include main connectors 406 to receive and return the cooling liquid from an external source. The main frame 404 may include internal fluid channels that direct the cooling liquid from an input of the main connectors 406 to each of the cooling devices. The cooling devices 102A-E may be coupled to fluid connectors on a top surface of the main frame 404 at fluid connection interfaces 512. For example, the cooling devices 102A-E may be coupled with the main frame via blind mating connectors or any other fluid connections. In some embodiments, the cooling devices 102A-E may each be attached to the corresponding PCIE package 302A-E to cool the electronics of the PCIE packages 302A-E by extracting heat through cooling surfaces of the cooling device 102A-E.

In some embodiments, a blocking plate 420 may be attached to the main frame 4040 and may extend across the entire width of the server 610. The blocking plate 420 may have a vertical height that extends above the main frame 404 to block any leaks that occur that the fluid connection interfaces 512 between the cooling devices 102A-E and the main from 404 from reaching the electronics of the PCB 615. Each of the cooling devices 102A-E may include a blocking channel that allows the cooling devices 102A-E to slide over the blocking plate 420 when coupled to both the main frame 404 and the PCIE packages 302A-E. The main frame 404 may also include leak detection channels 412 along a length of the main frame to detect any leaks that may occur at the fluid connection interfaces 512. In one embodiment, the blocking plate 420 can be a part of the server 610 component (e.g., integrated with the server chassis. Additionally, in some examples, the main frame 404 may then be a separate from the blocking plate 420.

Figure 7:
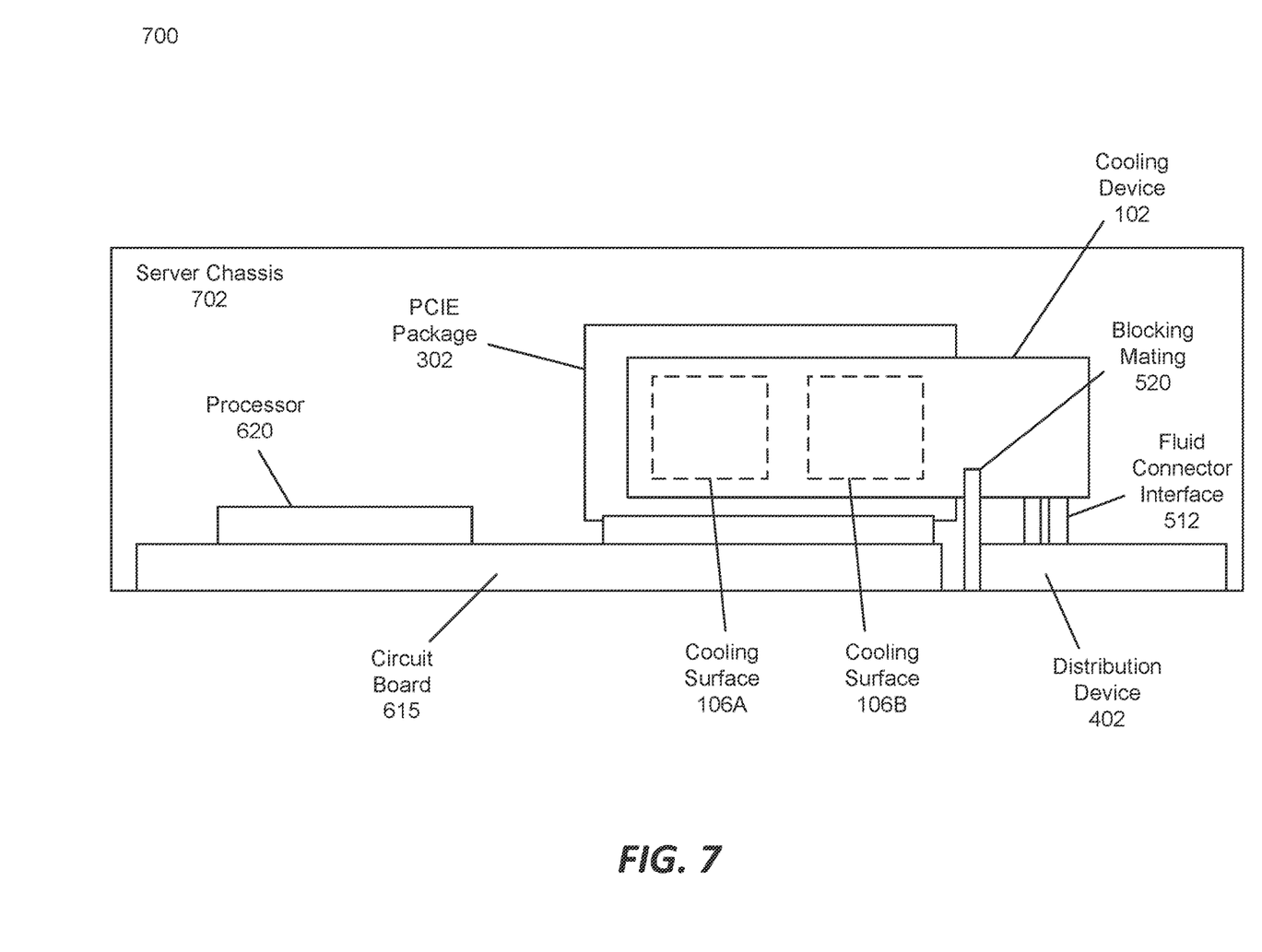
FIG. 7 shows a side view of a server with a high reliability cooling system, according to one embodiments.

FIG. 7 shows a side view 700 of a server with a high reliability cooling system according to some embodiments. A cooling distribution device may be integrated into the server chassis and one or more PCIE devices may be mounted on a PCB of the server. A cooling device may then be assembled with each PCIE device and the cooling distribution device. The cooling device may be coupled with the distribution device via fluid connections (e.g., blind mating connectors) and the blocking plate mating. The fluid channels of the cooling device are internal to the cooling device. Therefore, there are no external fluid connections on the electronics side of the blocking plate. Thus, the only potential fluid leaks may occur at the connection between the fluid connectors of the cooling device and the cooling distribution devices. Such potential leaks are segregated from the electronics of the server by the blocking plate and the mating of the blocking plate with the blocking channel of the cooling device.

In some embodiments, as depicted in FIG. 7, a server chassis 702 includes a PCB 615 and a cooling distribution device 402. A processor 620 and a PCIE package 302 may be coupled to the circuit board 615. The PCIE package 302 can include one or more electronic devices (e.g., GPUs). A cooling device 102 with one or more cooling surfaces 106A-B may be coupled to the PCIE package 302 to extract heat from the one or more electronic devices. The cooling device 102 may be coupled to the distribution device 402 via fluid connector interface 512. A blocking mating 520 between a blocking plate of the distribution device 402 and a blocking channel of the cooling device 102 may segregate the fluid connector interface 512 from the circuit board 615 and the electronics of the circuit board 615.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A cooling device, comprising:
an elongated chassis;
a cooling plate integrated and contained within the elongated chassis of the cooling device;
a fluid distribution channel integrated within the elongated chassis to provide cooling liquid to the cooling plate;
fluid connectors, wherein the fluid connectors receive the cooling liquid from a coolant distribution device; and
a blocking channel disposed between the cooling plate and the fluid connectors, wherein the blocking channel mates with a blocking plate of the coolant distribution device.

2. The cooling device of claim 1, wherein the blocking channel comprises:
a hollow channel across a bottom of the elongated chassis to receive the blocking plate upon connection of the cooling device to the coolant distribution device.

3. The cooling device of claim 1, wherein a cooling surface of the cooling plate is exposed on a surface of the elongated chassis to extract heat from one or more electronic devices.

4. The cooling device of claim 1, wherein the fluid connectors are disposed on a bottom surface of the elongated chassis.

5. The cooling device of claim 1, wherein the blocking plate of the coolant distribution device mated with the blocking channel of the cooling device fully segregates electronics of a server from the fluid connectors.

6. The cooling device of claim 1, wherein the coolant distribution device comprises:
at least one leak detection channel to detect cooling liquid leaks at a coupling of the fluid connectors of the cooling device to the coolant distribution device.

7. The cooling device of claim 6, wherein the at least one leak detection channel comprises a leak detection channel on each side of the coupling of the fluid connectors of the cooling device to the coolant distribution device.

8. A liquid cooling system, comprising:
a coolant distribution device comprising a first set of fluid connectors to receive a cooling liquid and a second set of fluid connectors to distribute coolant to a cooling device; and
the cooling device coupled to the coolant distribution device, wherein the cooling device comprises:
an elongated chassis;
a cooling plate integrated and contained within the elongated chassis of the cooling device;
a fluid distribution channel integrated within the elongated chassis to provide cooling liquid to the cooling plate;
fluid connectors, wherein the fluid connectors to receive the cooling liquid from the coolant distribution device; and
a blocking channel disposed between the cooling plate and the fluid connectors, wherein the blocking channel mates with a blocking plate of the coolant distribution device.

9. The liquid cooling system of claim 8, wherein the blocking channel comprises:
a hollow channel across a bottom of the elongated chassis to receive the blocking plate upon connection of the cooling device to the coolant distribution device.

10. The liquid cooling system of claim 8, wherein a cooling surface of the cooling plate is exposed on a surface of the elongated chassis to extract heat from one or more electronic devices.

11. The liquid cooling system of claim 8, wherein the fluid connectors are disposed on a bottom surface of the elongated chassis.

12. The liquid cooling system of claim 8, wherein the blocking plate of the coolant distribution device mated with the blocking channel of the cooling device fully segregates electronics of a server from the fluid connectors.

13. The liquid cooling system of claim 8, wherein the coolant distribution device comprises:
at least one leak detection channel to detect cooling liquid leaks at a coupling of the fluid connectors of the cooling device to the coolant distribution device.

14. The liquid cooling system of claim 13, wherein the at least one leak detection channel comprises a leak detection channel on each side of the coupling of the fluid connectors of the cooling device to the coolant distribution device.

15. An electronic server liquid cooling system, comprising:
a coolant distribution device to receive a cooling liquid and distribute the cooling liquid to a plurality of cooling devices; and the plurality of cooling devices coupled to the coolant distribution device, wherein each of the plurality of cooling devices comprises:
- an elongated chassis;
- a cooling plate integrated and contained within the elongated chassis of the cooling device;
- a fluid distribution channel integrated within the elongated chassis to provide cooling liquid to the cooling plate;
- fluid connectors, wherein the fluid connectors receive the cooling liquid from the coolant distribution device; and
- a blocking channel disposed between the cooling plate and the fluid connectors, wherein the blocking channel mates with a blocking plate of the coolant distribution device.

16. The electronic server liquid cooling system of claim 15, wherein the blocking channel comprises:
- a hollow channel across a bottom of the elongated chassis to receive the blocking plate upon connection of the corresponding cooling device of the plurality of cooling devices to the coolant distribution device.

17. The electronic server liquid cooling system of claim 15, wherein the blocking plate is integrated as part of a server chassis or packaged with the distribution device.

18. The electronic server liquid cooling system of claim 15, wherein the fluid connectors of the cooling device are disposed on a bottom of the elongated chassis to connect to the fluid connectors disposed on a top of the coolant distribution device.

19. The electronic server liquid cooling system of claim 15, wherein the blocking plate of the coolant distribution device mated with the blocking channel of the cooling device fully segregates electronics of a server from the fluid connectors.

20. The electronic server liquid cooling system of claim 15, wherein the coolant distribution device comprises:
- at least one leak detection channel to detect cooling liquid leaks at a coupling of the fluid connectors of the cooling device to the coolant distribution device.

* * * * *